US008951898B2

(12) United States Patent
Kono et al.

(10) Patent No.: US 8,951,898 B2
(45) Date of Patent: Feb. 10, 2015

(54) METHOD FOR MANUFACTURING A SILICON CARBIDE DIMOSFET

(71) Applicant: Kabushiki Kaisha Toshiba, Minato-ku (JP)

(72) Inventors: Hiroshi Kono, Kanagawa-ken (JP); Takashi Shinohe, Kanagawa-ken (JP); Takuma Suzuki, Kanagawa-ken (JP); Johji Nishio, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/172,059

(22) Filed: Feb. 4, 2014

(65) Prior Publication Data

US 2014/0147997 A1   May 29, 2014

Related U.S. Application Data

(62) Division of application No. 13/601,408, filed on Aug. 31, 2012, now Pat. No. 8,686,437.

(30) Foreign Application Priority Data

Feb. 29, 2012   (JP) ................................. 2012-043040

(51) Int. Cl.
 *H01L 21/265* (2006.01)
 *H01L 21/04* (2006.01)
 (Continued)

(52) U.S. Cl.
 CPC ...... *H01L 21/0465* (2013.01); *H01L 29/66477* (2013.01); *H01L 29/1608* (2013.01);
 (Continued)

(58) Field of Classification Search
 CPC ............ H01L 21/0465; H01L 29/1608; H01L 29/66477
 USPC .............................................. 438/519; 257/77
 See application file for complete search history.

(56) References Cited

U.S. PATENT DOCUMENTS

2007/0158658 A1* 7/2007 Ryu .................................. 257/77
2012/0056195 A1* 3/2012 Kono et al. ...................... 257/77

FOREIGN PATENT DOCUMENTS

JP   4-125972   4/1992
JP   2006-303272   11/2006
(Continued)

OTHER PUBLICATIONS

Japanese Office Action issued May 2, 2014, in Japan Patent Application No. 2012-043040 (with English translation).

*Primary Examiner* — Thao X Le
*Assistant Examiner* — Laura Dykes
(74) *Attorney, Agent, or Firm* — Oblon, Spivak, McClelland, Maier & Neustadt, L.L.P.

(57) ABSTRACT

According to one embodiment, a semiconductor device includes a first, a second, a third, a fourth, and a fifth semiconductor region, an insulating film, a control electrode, and a first and a second electrode. The first, the second, the third, the fourth and the fifth semiconductor region include silicon carbide. The first semiconductor region has a first impurity concentration, and has a first portion. The second semiconductor region is provided on the first semiconductor region. The third semiconductor region is provided on the second semiconductor region. The fourth semiconductor region is provided between the first portion and the second semiconductor region. The fourth semiconductor region is provided between the first portion and the third semiconductor region. The fifth semiconductor region includes a first region provided between the first portion and the second semiconductor region, and has a second impurity concentration higher than the first impurity concentration.

10 Claims, 11 Drawing Sheets

(51) Int. Cl.
  *H01L 29/66* (2006.01)
  *H01L 29/16* (2006.01)
  *H01L 29/739* (2006.01)
  *H01L 29/78* (2006.01)
  *H01L 29/08* (2006.01)
  *H01L 29/10* (2006.01)

(52) U.S. Cl.
  CPC ...... *H01L29/66068* (2013.01); *H01L 29/7395* (2013.01); *H01L 29/7802* (2013.01); *H01L 29/0878* (2013.01); *H01L 29/7827* (2013.01); *H01L 29/1095* (2013.01)
  USPC .......................................... 438/519; 257/77

(56) References Cited

FOREIGN PATENT DOCUMENTS

| | | |
|---|---|---|
| JP | 4627211 B2 | 2/2011 |
| JP | 2011-49267 | 3/2011 |

* cited by examiner

METHOD FOR MANUFACTURING A SILICON CARBIDE DIMOSFET

CROSS-REFERENCE TO RELATED APPLICATIONS

This application is a Divisional of and claims the benefit of priority under 35 U.S.C. §120 from U.S. Ser. No. 13/601,408, filed Aug. 31, 2012, and is based upon and claims the benefit of priority from the prior Japanese Patent Application No. 2012-043040, filed on Feb. 29, 2012; the entire contents of each of which are incorporated herein by reference.

FIELD

Embodiments described herein relate generally to a semiconductor device and a method for manufacturing the same.

BACKGROUND

Silicon carbide (SiC) has physical properties which are superior by three times in band gap, by about ten times in breakdown electric field strength, and by about three times in thermal conductivity compared with silicon (Si). Using such characteristics of SiC, it is possible to realize a semiconductor device which has low and superior high temperature operation. In the semiconductor device using SiC, it is desired that on-resistance is further decreased.

DETAILED DESCRIPTION

Figure 1:
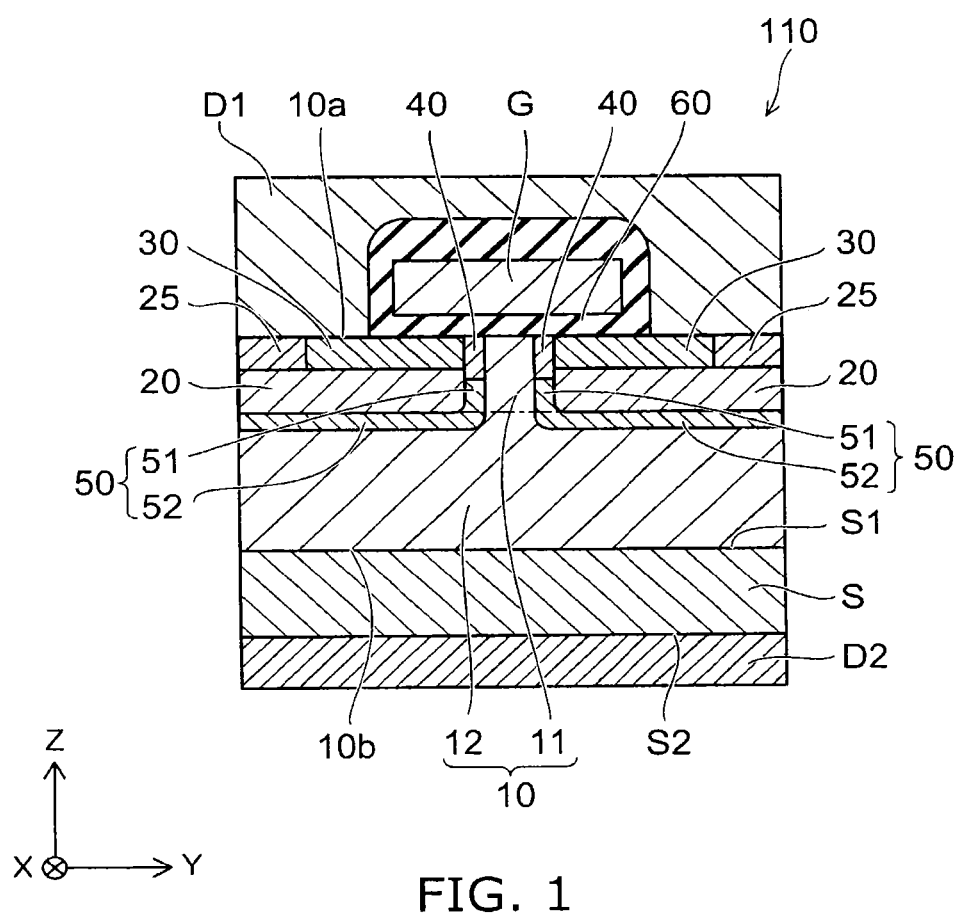
FIG. 1 is a cross-sectional view schematically illustrating a configuration of a semiconductor device according to a first embodiment.

In general, according to one embodiment, a semiconductor device includes a first semiconductor region, a second semiconductor region, a third semiconductor region, a fourth semiconductor region, a fifth semiconductor region, an insulating film, a control electrode, a first electrode, and a second electrode. The first semiconductor region includes silicon carbide of a first conductivity type. The first semiconductor region has a first impurity concentration. The first semiconductor region has a first portion. The second semiconductor region is provided on the first semiconductor region. The second semiconductor region includes silicon carbide of a second conductivity type. The third semiconductor region is provided on the second semiconductor region. The third semiconductor region includes silicon carbide of the first conductivity type. The fourth semiconductor region is provided between the first portion and the second semiconductor region. The fourth semiconductor region is provided between the first portion and the third semiconductor region. The fourth semiconductor region includes silicon carbide of the second conductivity type. The fifth semiconductor region includes a first region provided between the first portion and the second semiconductor region. The fifth semiconductor region includes silicon carbide of the first conductivity type. The fifth semiconductor region has a second impurity concentration higher than the first impurity concentration. The insulating film is provided on the first semiconductor region, the third semiconductor region and the fourth semiconductor region. The control electrode is provided on the insulating film. The first electrode is electrically connected to the third semiconductor region. The second electrode is electrically connected to the first semiconductor region.

Various embodiments will be described hereinafter with reference to the accompanying drawings.

The drawings are schematic and conceptual, and thus, the relationship between the thickness and width of each part, the ratio between the sizes of respective parts, and the like are not necessarily the same as in real parts. Further, even in a case where the same part is shown, the size or ratio thereof may be differently shown according to the drawings.

Further, in the specification and each drawing, the same elements as those described with reference to the previous drawings are given the same reference signs, and description thereof will be appropriately omitted.

Further, in the embodiments, specific examples in which a first conductivity type is an n-type and a second conductivity type is a p-type will be described.

Further, in the following description, the indications of $n^+$, n, $n^-$, $p^+$, p and $p^-$ represent a relative level of impurity concentration in the respective conductivity types. That is, $n^+$ has a relatively high n-type impurity concentration compared with that of n, and $n^-$ has a relatively low n-type impurity concentration compared with that of n. Further, $p^+$ has a relatively high p-type impurity concentration compared with that of p, and $p^-$ has a relatively low p-type impurity concentration compared with that of p.

First Embodiment

FIG. 1 is a cross-sectional view schematically illustrating a configuration of a semiconductor device according to a first embodiment.

Figure 2:
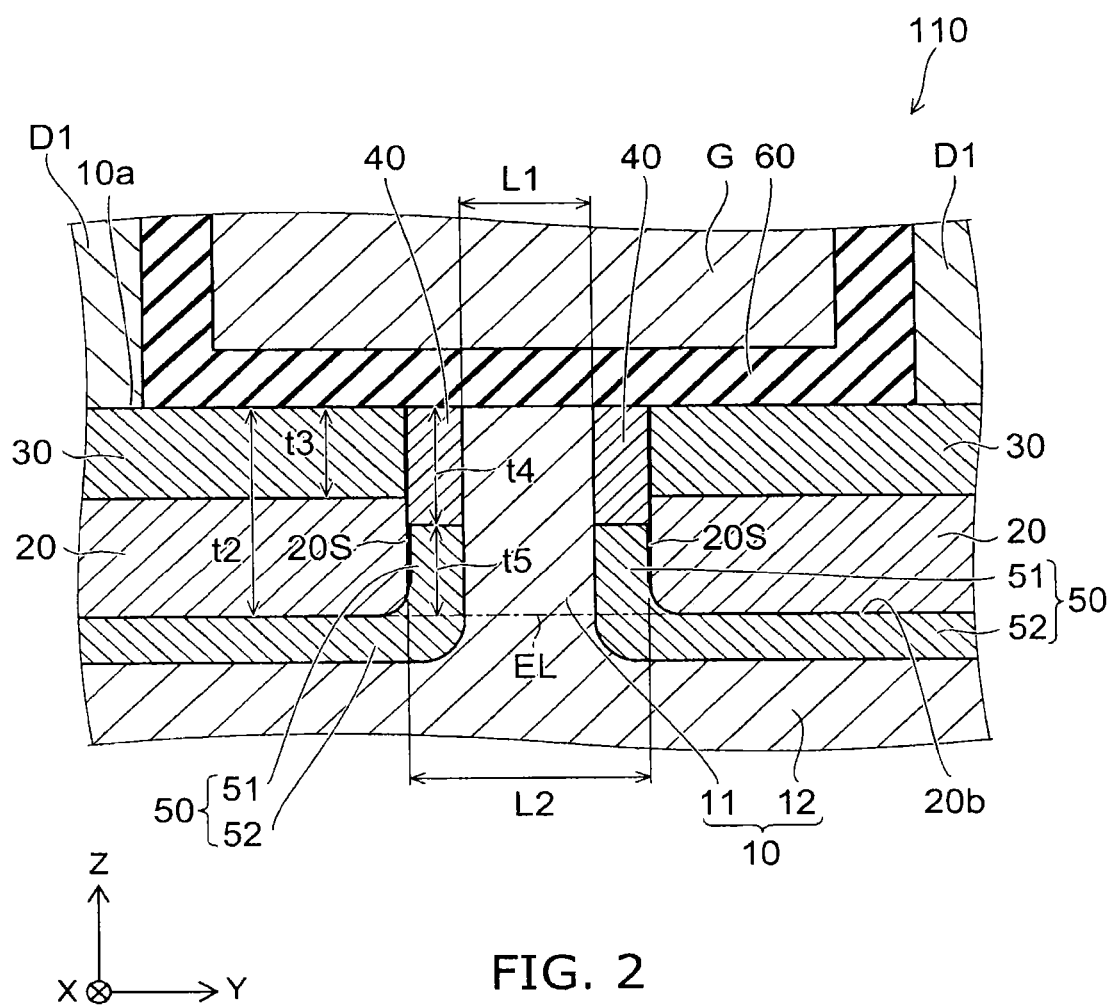
FIG. 2 is an enlarged cross-sectional view schematically illustrating the periphery of a channel in FIG. 1.

FIG. 2 is an enlarged cross-sectional view schematically illustrating the periphery of a channel in FIG. 1.

As shown in FIG. 1, a semiconductor device 110 according to the first embodiment includes a first semiconductor region 10, a second semiconductor region 20, a third semiconductor region 30, a fourth semiconductor region 40, a fifth semiconductor region 50, an insulating film 60, a control electrode G, a first electrode D1, and a second electrode D2. The semiconductor device 110 according to the first embodiment is a DIMOSFET (Double Implantation MOSFET) using silicon carbide (SiC).

The first semiconductor region 10 includes a first portion 11 which protrudes upward. The first semiconductor region 10 includes SiC of the first conductivity type ($n^{--}$-type). The semiconductor region 10 has a first impurity concentration.

In the embodiment, the first semiconductor region 10 is formed on an upper surface S1 of a substrate S which includes SiC of the first conductivity type (n$^+$-type) by epitaxial growth, for example.

Here, in the embodiment, a direction orthogonal to the upper surface S1 of the substrate S is referred to as the Z direction, one of directions orthogonal to the Z direction is referred to as the X direction, and a direction orthogonal to the Z direction and the X direction is referred to as the Y direction. Further, a direction which directs toward the first semiconductor region 10 from the substrate S is referred to as up (upper side), and a direction which directs toward the substrate S from the first semiconductor region 10 is referred to as down (lower side).

The first semiconductor region 10 includes a first portion 11 and a second portion 12. The first portion 11 is provided on a part of the second portion 12. The first portion 11 is a JFET (Junction Field Effect Transistor) region of the DIMOSFET. The second portion 12 is a drift region of the DIMOSFET.

The second semiconductor region 20 is provided on the first semiconductor region 10 in parallel with the first portion 11 and includes SiC of the second conductivity type (p-type). The second semiconductor region 20 is provided in a part other than the part in which the first portion 11 is provided, on the second portion 12. The second semiconductor region 20 is a p-type well of the DIMOSFET. The second semiconductor region 20 is provided between the second portion 12 of the first semiconductor region 10 and the third semiconductor region 30 which will be described later.

The third semiconductor region 30 includes SiC of the first conductivity type (n$^+$-type) provided on the second semiconductor region 20. The third semiconductor region 30 is a source region of the DIMOSFET.

A contact region 25 is provided adjacent to the third semiconductor region 30 on the second semiconductor region 20. The contact region 25 is a p$^+$-type having an impurity concentration higher than that of the second semiconductor region 20.

The fourth semiconductor region 40 includes SiC of the second conductivity type (p$^-$-type) provided between the second semiconductor region 20 and the third semiconductor region 30, and the first portion 11. The fourth semiconductor region 40 functions as a channel region of the DIMOSFET.

The fifth semiconductor region 50 includes a first region 51 which is provided between the second semiconductor region 20 and the first portion 11. The fifth semiconductor region 50 includes SiC of the first conductivity type (n$^-$-type). That is, the fifth semiconductor region 50 has a second impurity concentration. The second impurity concentration is higher than the first impurity concentration which is the impurity concentration of the first semiconductor region 10. Thus, the fifth semiconductor region 50 functions as a region which adjusts expansion of a depletion layer of the DIMOSFET.

The first region 51 is provided between the fourth semiconductor region 40 and the second portion 12 and between the third semiconductor region 30 and the first portion 11. The length of the first region 51 in a direction (Y direction) which connects the third semiconductor region 30 and the first portion 11 is approximately the same as the length of the fourth semiconductor region 40 in the Y direction. That is, the first region 51 is provided in a step portion which includes the side of the first portion 11 of the second semiconductor region 20 and an end portion of the side of the second portion 12 of the fourth semiconductor region 40.

In the embodiment, the fifth semiconductor region 50 includes a second region 52 which is connected to the first region 51. The second region 52 is provided on a side of the second semiconductor region 20 which is opposite to the third semiconductor region 30, that is, between the second semiconductor region 20 and the second portion 12 of the first semiconductor region 10. Thus, the fifth semiconductor region 50 is provided along a side surface and a lower surface of the second semiconductor region 20 from the lower side of the fourth semiconductor region 40.

The insulating film 60 is provided on the first semiconductor region 10, the third semiconductor region 30, and the fourth semiconductor region 40. When an upper surface where the first portion 11 of the first semiconductor region 10 is exposed and an extension plane thereof are represented as a first main surface 10a, the insulating film 60 has a portion which is continuously provided along the first main surface 10a. A part of the insulating film 60 which is provided between the first main surface 10a and the control electrode G which will be described later is a gate insulating film of the DIMOSFET. Further, the insulating film 60 functions as a film which forms insulation between the control electrode G and the first electrode D1 which will be described later.

As the insulating film 60, for example, silicon oxide, silicon nitride and high dielectric constant materials (high-k materials) are used.

The control electrode G is provided on the insulating film 60. That is, the control electrode G is provided through the part (gate insulating film) of the insulating film 60 which is provided on the main surface 10a. Thus, the control electrode G functions as a gate electrode of the DIMOSFET. As the control electrode G, for example, polycrystalline silicon and metallic materials (TiN, Al, Ru, W, TaSiN or the like) are used.

The first electrode D1 is electrically connected to the third semiconductor region 30. The first electrode D1 is electrically insulated from the control electrode G by the insulating film 60. The first electrode D1 is in contact with the third semiconductor region 30 which is exposed to the first main surface 10a. The first electrode D1 is a source electrode of the DIMOSFET. The first electrode D1 is also in contact with the contact region 25 which is exposed to the first main surface 10a in the embodiment. Thus, the first electrode D1 functions as a common electrode of the source region and the p-type well of the DIMOSFET.

The second electrode D2 is electrically connected to the first semiconductor region 10. The first semiconductor region 10 is connected to the substrate S on a second main surface 10b of the first semiconductor region 10 which is a surface opposite to the first main surface 10a. The second electrode D2 is provided on a lower surface S2 opposite to the upper surface S1 of the substrate S. The second electrode D2 is a drain electrode of the DIMOSFET.

In the semiconductor device 110 according to the first embodiment, expansion of the depletion layer to the first portion 11 is adjusted when the semiconductor device 110 is in an on-state due to the fifth semiconductor region 50. That is, in the semiconductor device 110, expansion of the depletion layer in the on-state is suppressed, compared with a case where the fifth semiconductor region 50 is not provided. Thus, JFET resistance is decreased to reduce on-resistance.

In the semiconductor device 110 according to the embodiment, one pair of second semiconductor regions 20, one pair of third semiconductor regions 30, one pair of fourth semiconductor regions 40, and one pair of fifth semiconductor regions 50 are provided, with the JFET region which is the first portion 11 being interposed therebetween. The JFET region is a region between the pair of fourth semiconductor regions 40 and between the pair of second semiconductor regions 20.

Further, the insulating film 60 is continuously provided on the first portion 11, on one pair of third semiconductor regions 30 and one pair of fourth semiconductor regions 40. The control electrode G is provided on the insulating film 60. Accordingly, one pair of the fourth semiconductor regions 40 (one pair of channels) is controlled using one control electrode G.

As illustrated in FIG. 2, the position of a bottom portion 20b of the second semiconductor region 20 in the Z direction is a position which is spaced from the first main surface 10a by t2. The third semiconductor region 30 is formed from the first main surface 10a to the position of t3 in the Z direction. The fourth semiconductor region 40 is formed from the first main surface 10a to the position of t4. When the first main surface 10a is a reference, t2 is larger than t3. Further, t4 is larger than t3, and is smaller than t2. That is, the fourth semiconductor region 40 is formed from the first main surface 10a to the middle of the second semiconductor region 20 in the Z direction.

The first region 51 of the fifth semiconductor region 50 is a region surrounded by a side surface 20s of the second semiconductor region 20, the first portion 11, and an extension line EL of the bottom portion 20b of the second semiconductor region 20 in the Y direction.

The length in the Y direction of the JFET region which is the first portion 11 varies according to the position in the Z direction. That is, the interval (length L1) in the Y direction between one pair of fourth semiconductor regions 40 with the first portion 11 being interposed therebetween is shorter than the interval (length L2) between one pair of second semiconductor regions 20 with the first portion 11 being interposed therebetween. The length in the Y direction of the fourth semiconductor region 40 which is the channel is 0.3 μm or more and 1.5 μm or less, for example, and the length L2 is 1.5 μm or more and 5.0 μm or less, for example.

In this way, in the JFET region which is the first portion 11, as the interval (length L1) between one pair of fourth semiconductor regions 40 which are the channels is shorter than the interval (length L2) between one pair of second semiconductor regions 20, JFET resistance is reduced and reduction in on-resistance of the DIMOSFET is achieved.

Here, the depths and impurity densities of the respective layers will be described.

The depth of the drift layer (first semiconductor region 10) is 5 μm or more and 10 μm or less, for example, and the impurity concentration thereof is $5 \times 10^{15}$ cm$^{-3}$ or more and $2 \times 10^{16}$ cm$^{-3}$ or less, for example. Further, in order to cope with high breakdown voltage, the depth is 5 μm or more and 50 μm or less, for example, and the impurity concentration is $1 \times 10^{15}$ cm$^{-3}$ or more and $2 \times 10^{16}$ cm$^{-3}$ or less, for example. Thus, a DIMOSFET having a breakdown voltage of several hundreds of volts (V) to 6500 V or more is realized.

The t2 corresponding to the depth of the p-type well (second semiconductor region 20) is 0.5 μm or more and 1.5 μm or less, for example, and the impurity concentration thereof is $1 \times 10^{17}$ cm$^{-3}$ or more and $5 \times 10^{18}$ cm$^{-3}$ or less, for example.

The t3 corresponding to the depth of the source region (third semiconductor region 30) is 0.1 μm or more and 0.3 μm or less, for example, and is 0.1 μm or more and 0.5 μm or less, for example, according the depth of the p side well, and the impurity concentration thereof is $1 \times 10^{19}$ cm$^{-3}$ or more and $5 \times 10^{20}$ cm$^{-3}$ or less, for example.

The depth of the contact region 25 (see FIG. 1) is 0.1 μm or more and 0.5 μm or less, for example, and the impurity concentration thereof is $1 \times 10^{19}$ cm$^{-3}$ or more and $5 \times 10^{20}$ cm$^{-3}$ or less, for example.

The t4 corresponding to the depth of the channel (fourth semiconductor region 40) is deeper than t3 corresponding to the depth of the third semiconductor region 30, and is 0.2 μm or more and 0.5 μm or less, for example, and the impurity concentration is $1 \times 10^{16}$ cm$^{-3}$ or more and $2 \times 10^{18}$ cm$^{-3}$ or less, for example. As the impurity concentration of the fourth semiconductor region 40, it is desired that the upper side thereof is approximately $5 \times 10^{15}$ cm$^{-3}$ or more and $5 \times 10^{16}$ cm$^{-3}$ or less, and the lower side thereof is approximately $1 \times 10^{18}$ cm$^{-3}$.

The first region 51 of the fifth semiconductor region 50 is a region surrounded by the side surface 20s of the second semiconductor region 20, the first portion 11, and the extension line EL of the bottom portion 20b of the second semiconductor region 20 in the Y direction. The length t51 of the first region 51 in the Z direction is 0.2 μm or more and 0.6 μm or less, for example. Further, the impurity concentration of the fifth semiconductor region 50 is $1 \times 10^{16}$ cm$^{-3}$ or more and $5 \times 10^{17}$ cm$^{-3}$ or less, for example, which is equal to or lower than the impurity concentration of the second semiconductor region 20.

The thickness of a portion of the insulating film 60 corresponding to a gate insulating film is 40 nm or more and 60 nm or less, for example.

Figure 3A:
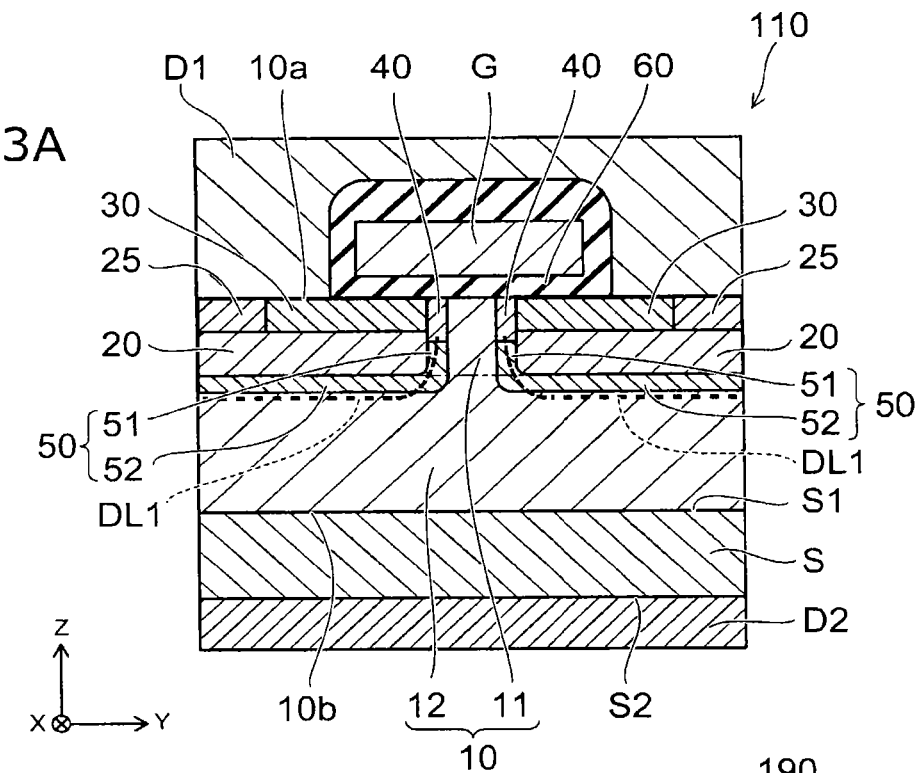
FIGS. 3A and 3B are cross-sectional views schematically illustrating comparison of the semiconductor device according to the embodiment with a semiconductor device according to a reference example.
Figure 3B:
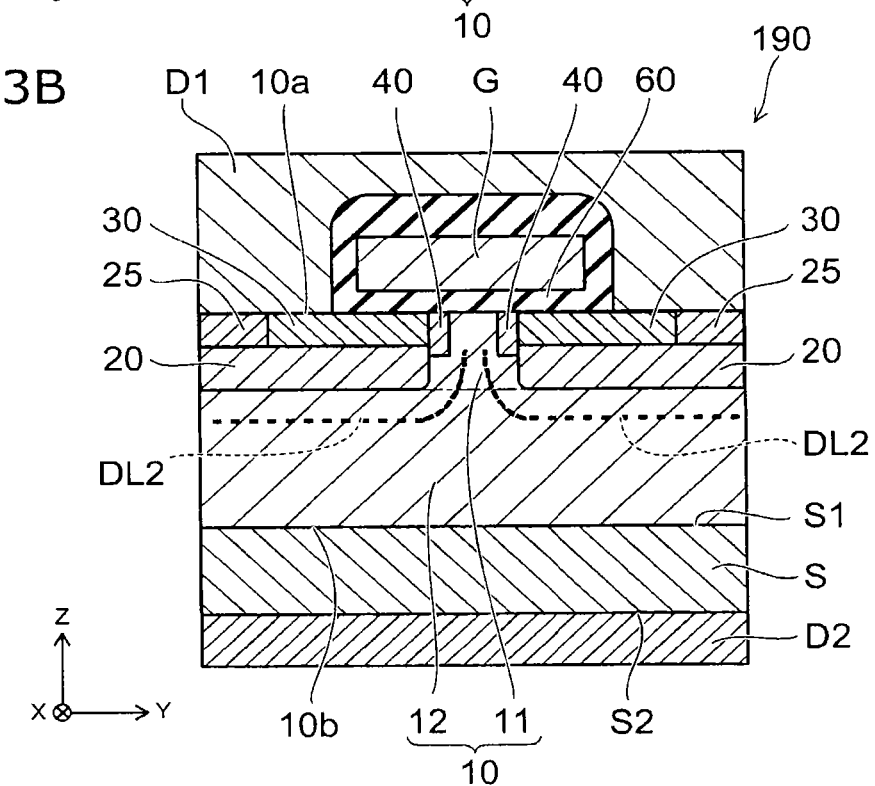

FIGS. 3A and 3B are cross-sectional views schematically illustrating comparison of the semiconductor device according to the embodiment with a semiconductor device according to a reference example.

FIG. 3A illustrates expansion of a depletion layer DL1 of the semiconductor device 110 according to the embodiment, and FIG. 3B illustrates expansion of a depletion layer DL2 of a semiconductor device 190 according to the reference example.

The semiconductor device 190 according to the reference example is different from the semiconductor device 110 according to the embodiment in that the fifth semiconductor region 50 is not provided.

As illustrated in FIGS. 3A and 3B, in the semiconductor devices 110 and 190, in an on-state of the DIMOSFET, the expansion of the depletion layers DL1 and DL2 occurs due to a p-n junction between the second semiconductor region 20 and the first semiconductor region 10.

At this time, in the semiconductor device 110 according to the embodiment illustrated in FIG. 3A, the expansion of the depletion layer DL1 is suppressed compared with the semiconductor device 190 according to the reference example illustrated in FIG. 3B. That is, in the semiconductor device 110 according to the embodiment, since the fifth semiconductor region 50 (depletion layer adjustment region) having an impurity concentration higher than that of the first semiconductor region 10 is provided, the expansion of the depletion layer DL1 in the on-state is decreased compared with the semiconductor device 190 according to the reference example.

Accordingly, in the semiconductor device 110 according to the embodiment, an increase in the JFET resistance caused by the expansion of the depletion layer DL1 in the JFET region in the on-state is suppressed compared with the semiconductor device 190 according to the reference example, and thus, reduction in on-resistance is achieved.

Further, in the semiconductor device 110 according to the embodiment, the expansion of the depletion layer DL1 to the side of the second portion of the first semiconductor region 10 from the second semiconductor region 20 is suppressed by the second region 52 of the fifth semiconductor region 50 provided between the second semiconductor region 20 and the second portion 12 of the first semiconductor region 10.

In the on-state of the DIMOSFET, electric current flows to the drift region (second portion 12) from the JFET region (first portion 11) and is expanded in the drift region to flow to the drain electrode (second electrode D2).

In the semiconductor device 110 according to the embodiment, since the expansion of the depletion layer DL1 to the side of the second portion from the second semiconductor region 20 is suppressed compared with the semiconductor device 190 according to the reference example, electric current easily spreads out the drift region from the JFET region. Thus, reduction in on-resistance is achieved.

Figures 4A, 4B:
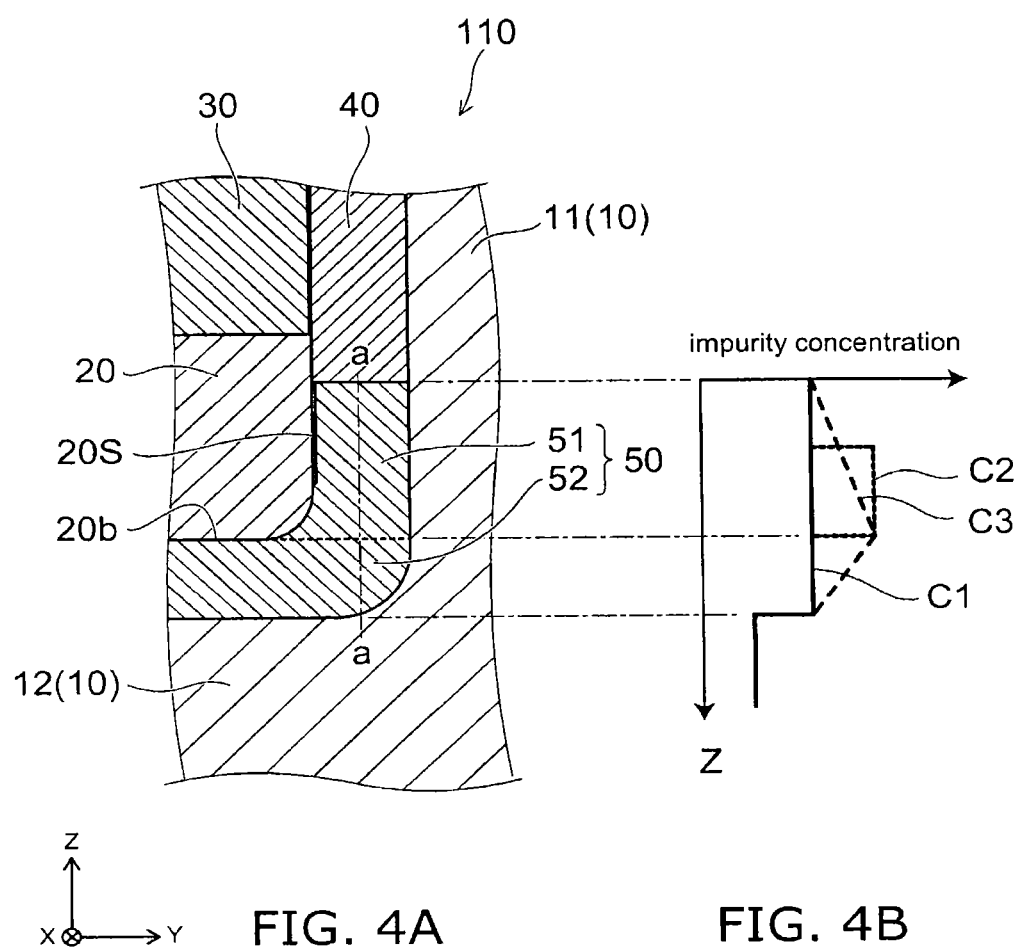
FIGS. 4A and 4B are diagrams schematically illustrating impurity concentration distribution of the fifth semiconductor region.

FIGS. 4A and 4B are diagrams schematically illustrating impurity concentration distribution of the fifth semiconductor region.

FIG. 4A illustrates an enlarged cross-sectional view schematically illustrating a part of the fifth semiconductor to region 50, and FIG. 4B illustrates impurity concentration change in a line (line a-a) taken along the Z direction in the central position of the Y axial length of the first region 51.

As illustrated in a concentration change C1 of FIG. 4B, in the semiconductor device 110 according to the embodiment, both impurity densities of the first region 51 and the second region 52 are higher than the impurity concentration of the first semiconductor region 10.

Further, in the semiconductor device 110 according to the embodiment, the impurity concentration of the first region 51 may be changed. For example, as illustrated in concentration changes C2 and C3 of FIG. 4B, the impurity concentration of the first region 51 may be gradually increased in a direction moving away from the fourth semiconductor region 40 (direction toward the second portion 12 of the first semiconductor region 10 from the fourth semiconductor region 40). In the concentration change C2, the impurity concentration of the first region 51 is gradually increased. The concentration indicating the concentration change C2 has two stages, but may be three stages or more. Further, in the concentration change C3, the impurity concentration of the first region 51 is continuously increased. The continuous increase may be linear or curved.

In the concentration changes C2 and C3, the impurity concentration of the fourth semiconductor region 40 of the first region 51 is lower than the impurity concentration of the second portion 12 of the first region 51. Thus, in a portion between one pair of second semiconductor regions 20 in the JFET region, the more being separated from the fourth semiconductor region 40, the more the expansion of the depletion layer is suppressed, and thus, reduction in on-resistance is achieved. Further, in a portion close to the fourth semiconductor region 40 which becomes the channel, improvement in breakdown voltage is achieved due to the expansion of the depletion. That is, in the semiconductor device 110 according to the embodiment, the impurity concentration of the first region 51 is adjusted, and thus, balance reduction in on-resistance and improvement in to breakdown voltage are achieved.

As illustrated in the concentration change C3, the impurity concentration of the second region 52 may be gradually decreased in a direction moving away from the second semiconductor region 20. The expansion of the depletion layer in the on-state is adjusted according to change in the impurity densities of the first region 51 and the second region 52, and balance between reduction in on-resistance and improvement in breakdown voltage is achieved.

Second Embodiment

Figure 5:
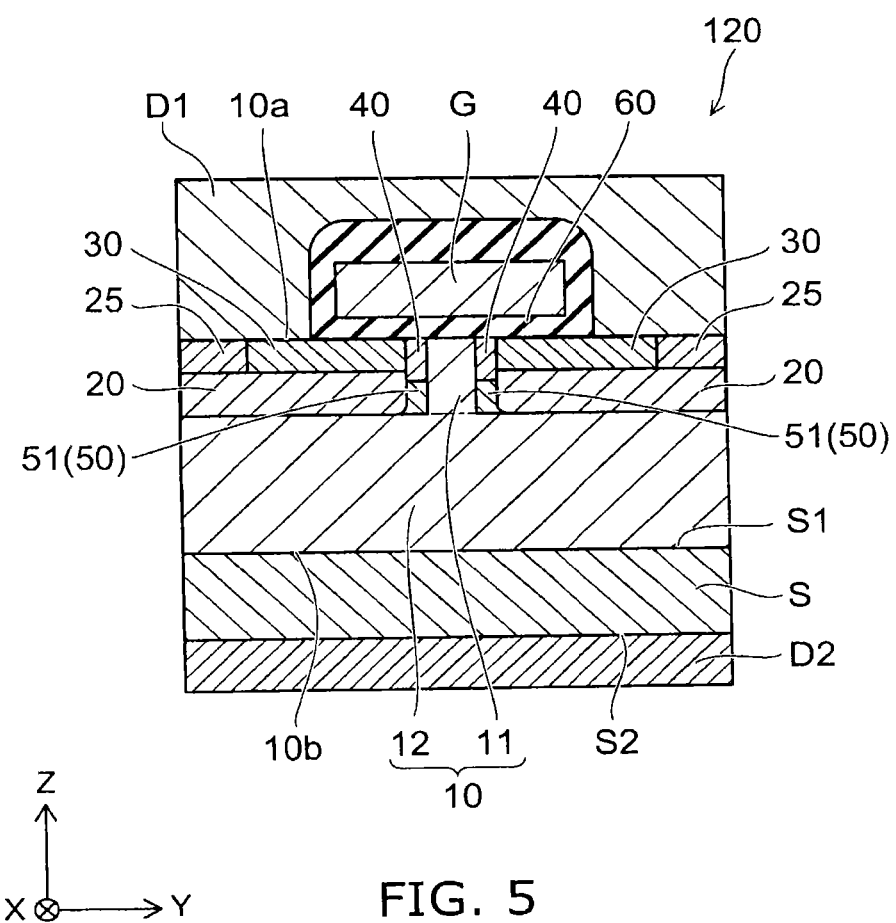
FIG. 5 is a cross-sectional view schematically illustrating a configuration of a semiconductor device according to a second embodiment.

FIG. 5 is a cross-sectional view schematically illustrating a configuration of a semiconductor device according to a second embodiment.

As illustrated in FIG. 5, a semiconductor device 120 according to the second embodiment is different from the semiconductor device 110 according to the first embodiment illustrated in FIG. 1 in that the second region 52 of the fifth semiconductor region 50 is not provided. That is, in the semiconductor device 120, only the first region 51 is provided as the fifth semiconductor device 50.

Even using only the first region 51 as the fifth semiconductor region 50 as in the semiconductor device 120, the expansion of the depletion layer in the first portion 11 (JFET region) in the on-state is suppressed, and thus, reduction in on-resistance is achieved. The impurity concentration distribution of the first region 51 is the same as in the examples illustrated in FIGS. 4A and 4B.

Third Embodiment

Next, a method of manufacturing a semiconductor device will be described as a third embodiment.

Figure 6:
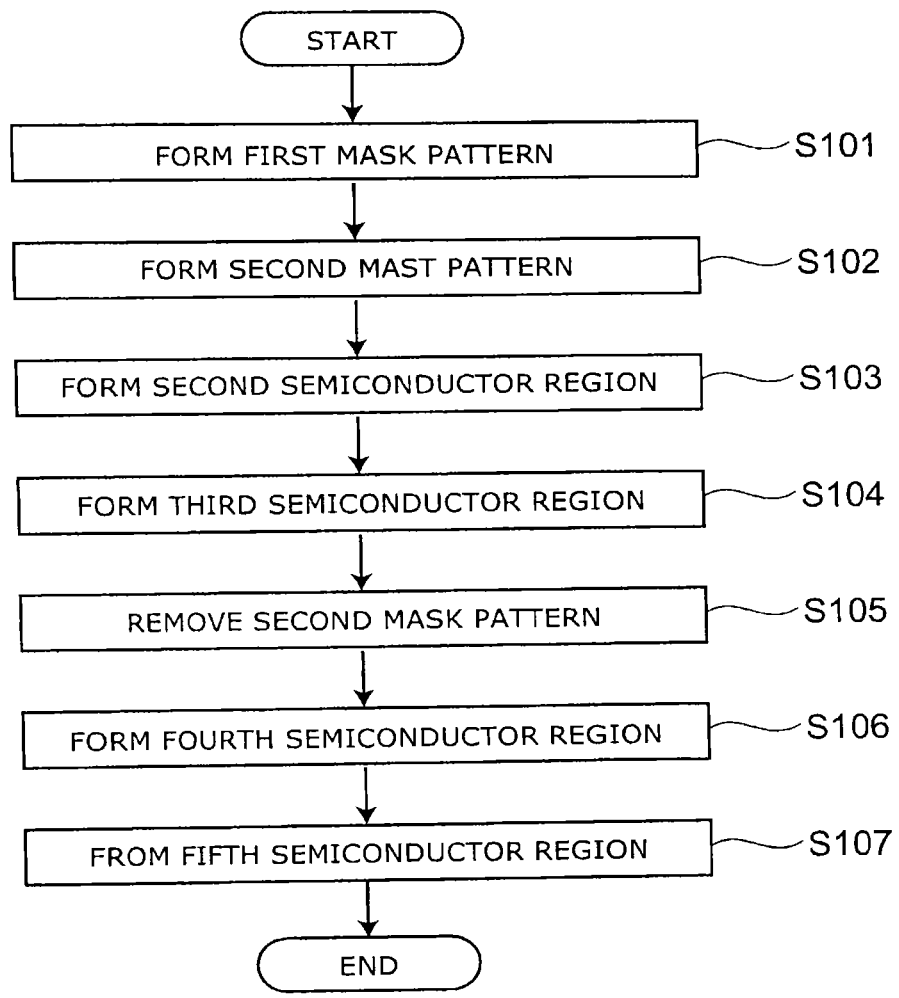
FIG. 6 is a flowchart illustrating the method of manufacturing the semiconductor device according to the third embodiment.

FIG. 6 is a flowchart illustrating the method of manufacturing the semiconductor device according to the third embodiment.

That is, the manufacturing method includes a first mask pattern forming process (step S101), a second mask pattern forming process (step S102), a second semiconductor region forming process (step S103), a third semiconductor region forming process (step S104), a second mask pattern removal process (step S105), a fourth semiconductor region forming process (S106), and a fifth semiconductor region forming process (step S107).

Next, a specific example of the manufacturing method will be described.

FIGS. 7A to 10B are cross-sectional views schematically illustrating the method of manufacturing the semiconductor device.

In FIGS. 7A to 10B, the method of manufacturing the semiconductor device 110 according to the first embodiment is shown as an example.

Figure 7A:
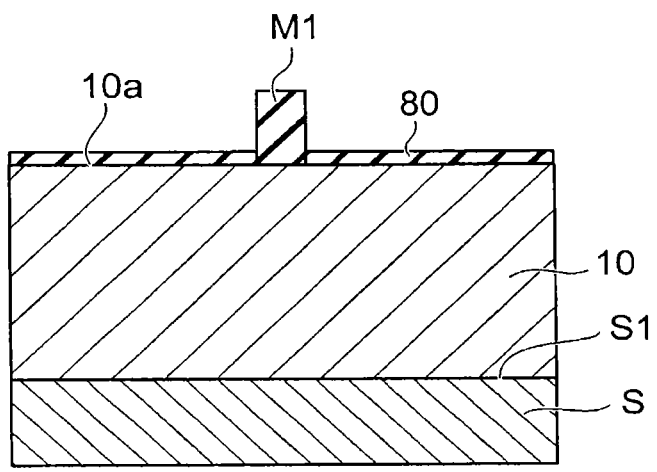
FIGS. 7A to 10B are cross-sectional views schematically illustrating the method of manufacturing the semiconductor device.
Figure 7A:
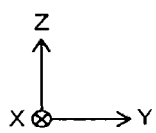

Firstly, as illustrated in FIG. 7A, a substrate S which includes SiC is prepared. The substrate S includes phosphorous (P) or nitrogen (N) having an impurity concentration of approximately $1 \times 10^{19}$ cm$^{-3}$, as the n-type impurity, for example, and has a thickness of 300 µm, for example.

Next, the first semiconductor region 10 is formed on the upper surface S1 of the substrate S. The first semiconductor region 10 is formed by epitaxial growth, for example. The first semiconductor region 10 includes nitrogen (N) having an impurity concentration of $5 \times 10^{15}$ cm$^{-3}$ or more and $2 \times 10^{16}$ cm$^{-3}$ or less, for example, as the n-type impurity, and has a thickness of 5 µm or more and 10 µm or less, for example. Further, if a higher breakdown voltage is necessary, the first semiconductor region 10 may include N having an impurity concentration of $1 \times 10^{15}$ cm$^{-3}$ or more and $2 \times 10^{16}$ cm$^{-3}$ or less, for example, and may have a thickness of 5 µm or more and 50 µm or less, for example.

Next, a first mask pattern M1 is formed on the main surface 10a of the first semiconductor region 10. The first mask pattern M1 is formed by performing photolithography and etching for silicon oxide, for example. The first mask pattern M1 is formed at a position which is overlapped with the JFET region as viewed in the Z direction. Then, a first film 80 is formed. As the first film 80, silicon oxide is used, for example.

The first mask pattern M1 may be integrally formed with the first film 80.

Figure 7B:
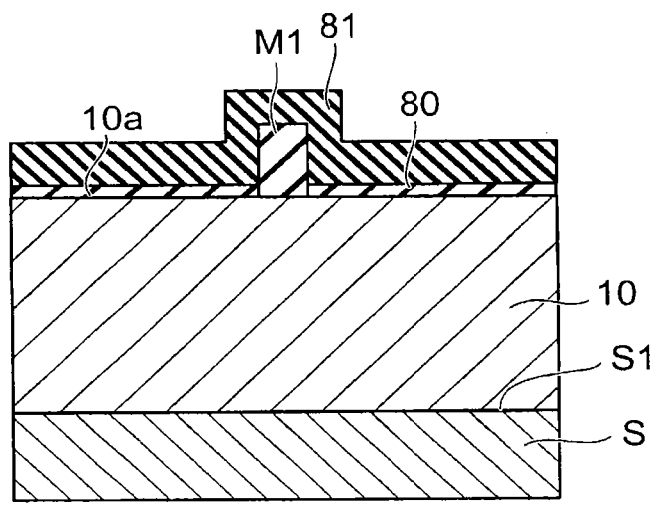
Figure 7B:
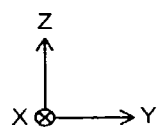

Next, as illustrated in FIG. 7B, a second film 81 is formed on the first film 80 and the first mask pattern M1. As the second film 81, for example, polycrystalline silicon is used.

The second film 81 may be formed to cover the first film 81 and the first mask pattern M1 by CVD (Chemical Vapor Deposition), for example.

Figure 8A:
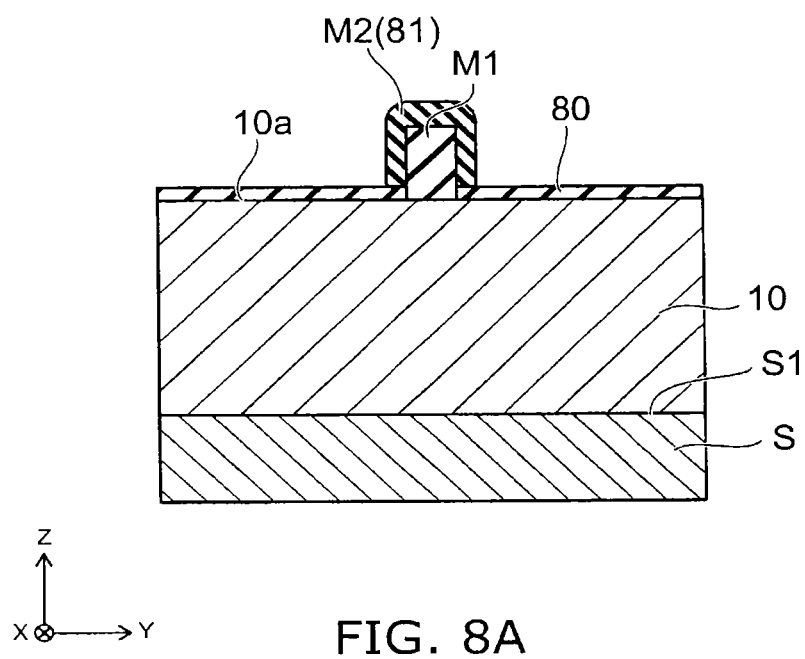

Then, as illustrated in FIG. 8A, the second film 81 is etched to allow the second film 81 having a predetermined thickness to remain on a side surface of the first mask pattern M1. The remaining second film 81 becomes a second mask pattern M2. The thickness of the second mask pattern (length in the Y direction from the side surface of the first mask pattern M1) corresponds to the length of the fourth semiconductor region 40 which is the channel region.

Figure 8B:
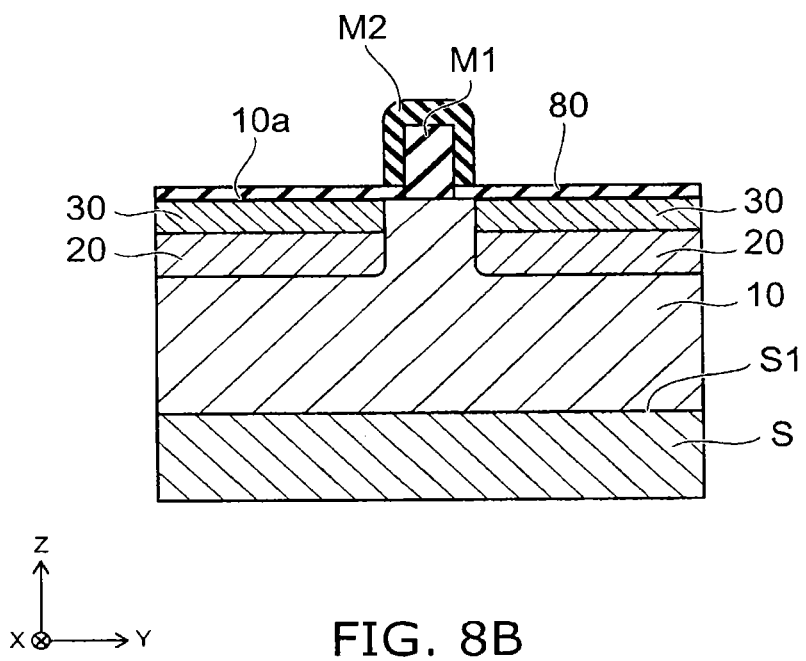

Next, as illustrated in FIG. 8B, ion implantation is performed for the first semiconductor region 10 through the second mask pattern M2, to form the second semiconductor region 20. For example, aluminum (Al) which is the p-type impurity is ion-implanted to the first semiconductor region 10, to form the second semiconductor region 20 which is a p-type well.

The depth of the second semiconductor region 20 is 0.5 µm or more and 0.8 µm or less, for example, and the impurity concentration thereof is $1\times10^{17}$ cm$^{-3}$ or more and $5\times10^{18}$ cm$^{-3}$ or less, for example. Here, in order to adjust the final concentration of the second semiconductor region 20, N which is the n-type impurity may be added for ion implantation.

Next, ion implantation is similarly performed for the second semiconductor region 20 through the second mask pattern M2, to form the third semiconductor region 30. For example, P which is an n-type impurity is ion-implanted to the second semiconductor region 20, to form the third semiconductor region 30 on the second semiconductor region 20.

The depth of the third semiconductor region 30 is 0.1 µm or more and 0.3 µm or less, for example, and the impurity concentration thereof is $1\times10^{19}$ cm$^{-3}$ or more and $5\times10^{20}$ cm$^{-3}$ or less, for example.

Figure 9A:
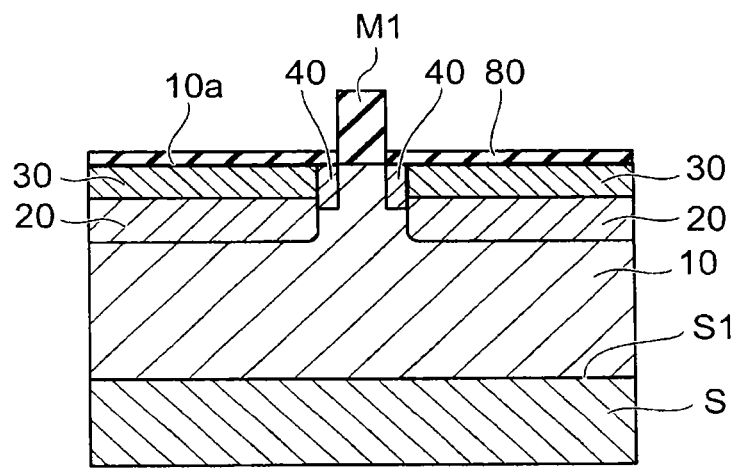

After the second semiconductor region 20 and the third semiconductor region 30 are formed, the second mask pattern M2 is removed. In removal of the second mask pattern M2, an etchant which etches only the material of the second mask pattern M2 and does not etch the first mask pattern M1 and the first film 80 is used. Thus, as shown in FIG. 9A, the first film 80 and the first mask pattern M1 remain on the first main surface 10a.

Then, ion implantation is performed for the first semiconductor region 10 through the first mask pattern M1, to form the fourth semiconductor region 40. For example, Al which is the p-type impurity is ion-implanted to the first semiconductor region 10, to form the fourth semiconductor region 40 which is the channel region. The depth of the fourth semiconductor region 40 is greater than t3 corresponding to the depth of the third semiconductor region 30. The depth is 0.2 µm or more and 0.5 µm or less, for example, and the impurity concentration thereof is $1\times10^{16}$ cm$^{-3}$ or more and $2\times10^{18}$ cm$^{-3}$ or less, for example. The fourth semiconductor region 40 is provided on the first semiconductor region 10 between the first mask pattern M1 and the third semiconductor region 30 as viewed in the Z direction. In the embodiment, since the fourth semiconductor region 40 which is the channel region is individually formed, it is easy to adjust the impurity concentration of the channel region.

Figure 9B:
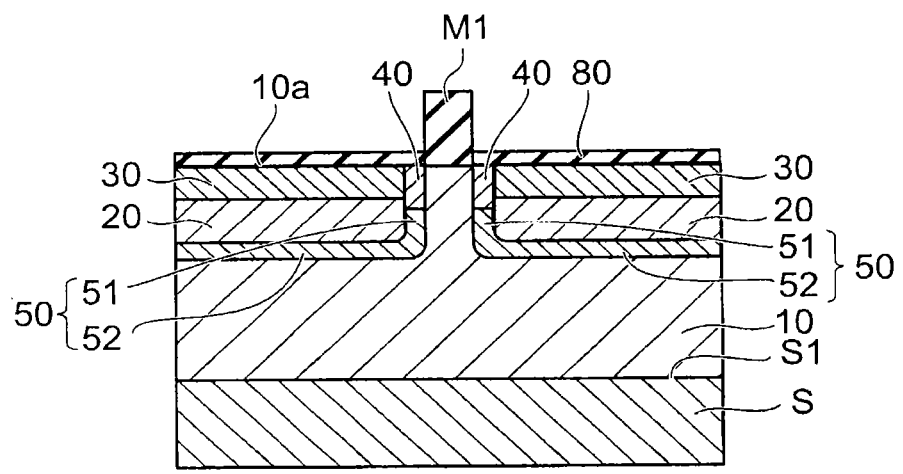

Next, as illustrated in FIG. 9B, the fifth semiconductor region 50 is formed on the first semiconductor region 10 through the first mask pattern M1. The first region 51 of the fifth semiconductor region 50 is formed on the lower side of the fourth semiconductor region 40, and the second region 52 is formed on the lower side of the second semiconductor region. For example, N or P which is the n-type impurity is ion-implanted to the first semiconductor region 10, to form the fifth semiconductor region 50.

The impurity concentration of the fifth semiconductor region 50 is $1\times10^{16}$ cm$^{-3}$ or more and $5\times10^{17}$ cm$^{-3}$ or less, for example. Further, the impurity concentration of the fifth semiconductor region 50 is lower than the impurity concentration of the second semiconductor region 20. In the embodiment, the fifth semiconductor region 50 is formed by the first mask pattern M1 used when the fourth semiconductor region 40 is formed. Accordingly, in order to form the fifth semiconductor region 50, it is not necessary to form another mask pattern.

Figure 10A:
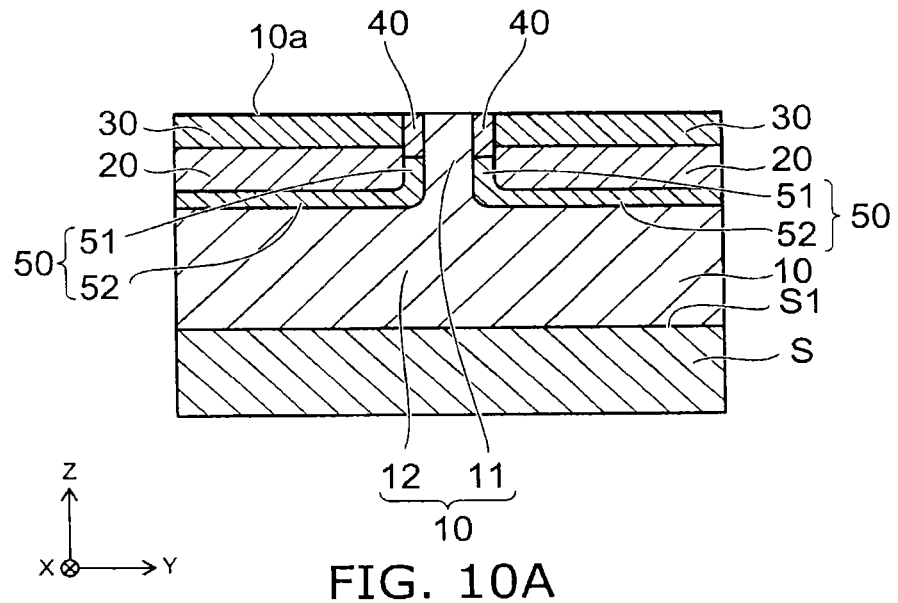
Figure 10B:
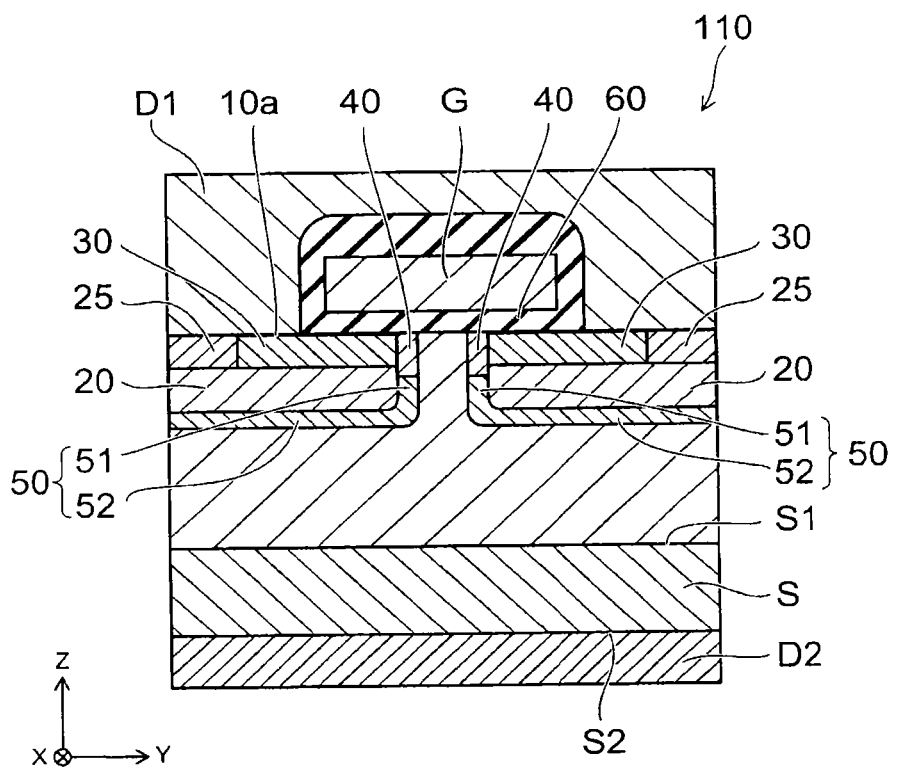

Next, as illustrated in FIG. 10A, the first mask pattern M1 (see FIG. 9B) and the first film 80 (see FIG. 9B) are removed. Then, as illustrated in FIG. 10B, the contact region 25, the insulating film 60, the control electrode G and the first electrode D1 are formed by known semiconductor processes. Further, the second semiconductor D2 is formed on the lower surface S2 of the substrate S. Thus, the semiconductor device 110 is completely formed.

In the method of manufacturing the semiconductor device according to the embodiment, since the fifth semiconductor region 50 is formed by the first mask pattern M1 used when the fourth semiconductor region 40 is formed, the mask pattern forming process is simplified. Thus, the semiconductor device 110 is easily and stably formed.

Fourth Embodiment

Figure 11:
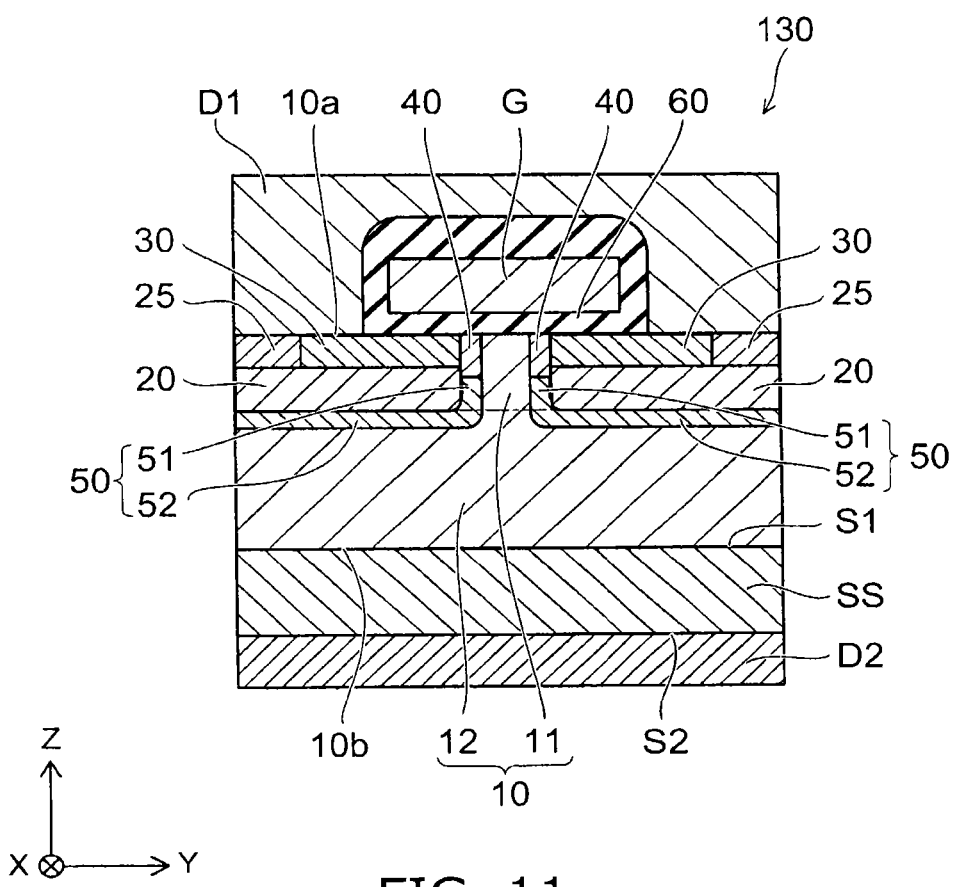
FIG. 11 is a cross-sectional view schematically illustrating a semiconductor device according to a fourth embodiment.

FIG. 11 is a cross-sectional view schematically illustrating a semiconductor device according to a fourth embodiment.

As illustrated in FIG. 11, a semiconductor device 130 according to the fourth embodiment is an IGBT (Insulated Gate Bipolar Transistor).

In the semiconductor device 130, a conductivity type of a substrate SS is different from the conductivity type of the substrate S of the semiconductor device 110 according to the first embodiment. That is, the conductivity type of the substrate SS of the semiconductor device 130 is the p$^+$-type, whereas the conductivity type of the substrate S of the semiconductor device 110 is the n$^+$-type. The semiconductor device 130 is the same as the semiconductor device 110 except that the conductivity types of the substrates S and SS are different from each other.

The substrate SS is a hexagonal crystal SiC substrate which includes Al, for example, as a p-type impurity, having an impurity concentration of approximately $5\times10^{18}$ cm$^{-3}$ to $1\times10^{19}$ cm$^{-3}$. In the semiconductor device 130 which is the IGBT, the control electrode G is a gate electrode, the first electrode D1 is an emitter electrode, and the second electrode D2 is a collector electrode. In the semiconductor device 130, reduction in on-resistance is achieved, in a similar way to the semiconductor device 110.

As described above, according to the semiconductor device of the embodiments and the manufacturing method thereof, it is possible to reduce on-resistance of the semiconductor device.

For example, in the above-described respective embodiments, the first conductivity type is the n-type and the second conductivity type is the p-type, but the invention may also be applied to a case where the first conductivity type is the p-type and the second conductivity type is the n-type. Further, the semiconductor devices 110 and 120 may also be applied to a MOSFET other than the DIMOSFET.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
    forming a first film on a main surface of a first semiconductor region, the first film including silicon carbide of a first conductivity type, the first film having a first impurity concentration, and forming a first mask pattern on the first film;
    forming a second film on the first film and the first mask pattern,
    forming a second mask pattern using the second film remaining on a side surface of the first mask pattern through etching of the second film;
    forming a second semiconductor region by implanting ions to the first semiconductor region through the second mask pattern, the second semiconductor region including silicon carbide of a second conductivity type;
    forming a third semiconductor region, on the second semiconductor region, by implanting ions to the second semiconductor region through the second mask pattern, the third semiconductor region including silicon carbide of the first conductivity type;
    removing the second mask pattern;
    forming a fourth semiconductor region in a region of the first semiconductor region outside of the second semiconductor region between the second semiconductor region and the third semiconductor region and the first mask pattern as viewed in a direction orthogonal to the main surface, by implanting ions to the first semiconductor region through the first mask pattern, the fourth semiconductor region including silicon carbide of the second conductivity type; and
    forming a fifth semiconductor region in a first region adjacent to the second semiconductor region on the lower side of the fourth semiconductor region, by implanting ions to the first semiconductor region through first mask pattern, the fifth semiconductor region including silicon carbide of the first conductivity type, the fifth semiconductor region having a second impurity concentration higher than the first impurity concentration.

2. The method according to claim 1, wherein the forming of the fifth semiconductor region includes forming a second region provided between the second semiconductor region and the first semiconductor region, the second region connected to the first region.

3. The method according to claim 1, wherein in the forming of the fifth semiconductor region, the fifth semiconductor region is formed so that an impurity concentration of the first region is gradually increased in a direction toward the first portion from the fourth semiconductor region.

4. The method according to claim 1, wherein the forming of the fifth semiconductor region includes forming a second region provided between the third semiconductor region and the first semiconductor region, the second region connected to the first region.

5. The method according to claim 1, wherein
    the forming of the third semiconductor region includes setting an impurity concentration of the third semiconductor region to a third impurity concentration, and
    the forming of the fourth semiconductor region includes setting an impurity concentration of the fourth semiconductor region to a fourth impurity concentration being equal to or lower than the third impurity concentration.

6. The method according to claim 1, wherein the forming of the fifth semiconductor region includes setting the impurity concentration of the first region to be gradually increased in a direction away from the fourth semiconductor region.

7. The method according to claim 1, wherein the forming of the fifth semiconductor region includes setting a width of the fifth semiconductor region to be equal to a width of the fourth semiconductor region.

8. The method according to claim 1, wherein the forming of the first mask pattern includes forming the first semiconductor region on a substrate, the substrate including silicon carbide.

9. The method according to claim 1, wherein
    the forming of the second semiconductor region includes forming a pair of the second semiconductor regions through the second mask pattern,
    the forming of the third semiconductor region includes forming a pair of the third semiconductor regions through the second mask pattern,
    the forming of the fourth semiconductor region includes forming a pair of the fourth semiconductor regions through the first mask pattern, and
    the forming of the fifth semiconductor region includes forming a pair of the fifth semiconductor regions through the first mask pattern.

10. The method according to claim 9, wherein the forming of the fourth semiconductor region includes setting an interval between the pair of the fourth semiconductor regions in a direction connecting the third semiconductor region and the first portion to be shorter than an interval between the pair of the second semiconductor regions in the direction.

* * * * *